US011421855B2

(12) United States Patent
Newell (10) Patent No.: US 11,421,855 B2
(45) Date of Patent: Aug. 23, 2022

(54) WHITE LIGHT PHOSPHOR DEVICE (71) Applicant: MATERION CORPORATION, Mayfield Heights, OH (US)

(72) Inventor: Michael P. Newell, Mayfield Heights, OH (US)

(73) Assignee: MATERION CORPORATION, Mayfield Heights, OH (US)

(*) Notice: Subject to any disclaimer, the term of this patent is extended or adjusted under 35 U.S.C. 154(b) by 66 days.

(21) Appl. No.: 17/040,132

(22) PCT Filed: May 17, 2019

(86) PCT No.: PCT/US2019/032838
§ 371 (c)(1),
(2) Date: Sep. 22, 2020

(87) PCT Pub. No.: WO2019/226479
PCT Pub. Date: Nov. 28, 2019

(65) Prior Publication Data
US 2021/0071845 A1    Mar. 11, 2021

Related U.S. Application Data

(60) Provisional application No. 62/675,844, filed on May 24, 2018.

(51) Int. Cl.
*F21V 9/32* (2018.01)
*F21K 9/64* (2016.01)
(Continued)

(52) U.S. Cl.
CPC .................. *F21V 9/32* (2018.02); *F21K 9/64* (2016.08); *G03B 21/204* (2013.01); *H01L 33/10* (2013.01);
(Continued)

(58) Field of Classification Search
CPC ... F21V 9/32; F21K 9/64; H01L 33/10; H01L 33/507; H01L 33/508; H01L 33/50;
(Continued)

(56) References Cited

U.S. PATENT DOCUMENTS

2009/0039375 A1    2/2009 Letoquin et al.
2010/0117106 A1    5/2010 Trottier
(Continued)

FOREIGN PATENT DOCUMENTS

CN    101755347    6/2010
CN    103155186    6/2013
(Continued)

OTHER PUBLICATIONS

International Search Report dated Sep. 24, 2019; PCT/US2019/032838.
(Continued)

*Primary Examiner* — Joseph L Williams
*Assistant Examiner* — Jose M Diaz
(74) *Attorney, Agent, or Firm* — Tucker Ellis LLP (57) ABSTRACT

A white light source includes a light source and a phosphor conversion component. The light source emits short wavelength light peaked at a peak wavelength of 570 nanometers or shorter. The phosphor conversion component includes a light conversion layer comprising a phosphor effective to convert the short wavelength light to converted light. The light conversion layer includes light passages comprising openings or passage material that does not comprise the phosphor and is light transmissive for the short wavelength light. The light source is disposed respective to the phosphor conversion component so as to illuminate the light conversion layer with the emitted short wavelength light and to pass the short wavelength light through the light passages.

21 Claims, 4 Drawing Sheets

(51) Int. Cl.
*G03B 21/20* (2006.01)
*H01L 33/10* (2010.01)
*H01L 33/50* (2010.01)
*F21Y 115/10* (2016.01)

(52) U.S. Cl.
CPC .......... *H01L 33/507* (2013.01); *H01L 33/508* (2013.01); *F21Y 2115/10* (2016.08)

(58) Field of Classification Search
CPC .............. F21Y 2105/10; F21Y 2115/30; F21Y 2115/10; G03B 21/208; G03B 21/204; G03B 21/2013; G03B 21/2066; G03B 21/2073; G03B 33/12; G02B 26/008; G02B 27/141; G02B 27/1046; H04N 9/3158; H04N 9/3167; H04N 9/3164; H04N 9/3161

See application file for complete search history.

(56) References Cited

U.S. PATENT DOCUMENTS

| 2015/0219936 | A1 | 8/2015 | Kim et al. |
| 2015/0377430 | A1 | 12/2015 | Bhakta |
| 2018/0038559 | A1 | 2/2018 | Mueller |
| 2021/0071845 | A1 | 3/2021 | Newell |

FOREIGN PATENT DOCUMENTS

| CN | 103576322 | | 2/2014 |
| CN | 104100898 | A * | 10/2014 |
| CN | 107703706 | | 2/2018 |
| WO | 2009005311 | | 8/2009 |
| WO | 2019226479 | | 11/2019 |

OTHER PUBLICATIONS

CN Appl. No. 2019800339219—1st Office action and summary dated Sep. 10, 2021.
CN Appl. No. 2019800339219—2nd Office action and summary dated Feb. 25, 2022.

* cited by examiner

WHITE LIGHT PHOSPHOR DEVICE

CROSS-REFERENCE TO RELATED APPLICATIONS

This application claims priority to U.S. Provisional Patent Application Ser. No. 62/675,844, filed May 24, 2019, which is fully incorporated by reference herein.

BACKGROUND

The following relates to the illumination arts, phosphor wheel arts, optical interference filter manufacturing arts, and related arts.

Some known phosphor based light sources use a yellow phosphor which is excited by a blue LED or laser. In order to create white light, additional blue light is provided and mixed with the yellow light in the right proportions in order to create white light with a desired color temperature. A known approach is to employ a yellow phosphor layer that converts only a fraction of the blue light, while the remainder of the blue light transmits through the yellow phosphor layer without conversion and thereby mixes with the converted yellow light. The thickness of the yellow phosphor layer is chosen to tune to a desired ratio of direct blue light and converted yellow light in the mixture.

Some improvements are disclosed herein.

BRIEF SUMMARY

In one disclosed aspect, a white light source is disclosed, comprising a light source and a phosphor conversion component. The light source emits short wavelength light peaked at a peak wavelength of 570 nanometers or shorter. The phosphor conversion component includes a light conversion layer comprising a phosphor effective to convert the short wavelength light to converted light. The light conversion layer includes light passages comprising openings or passage material that does not comprise the phosphor and is light transmissive for the short wavelength light. The light source is disposed respective to the phosphor conversion component so as to illuminate the light conversion layer with the emitted short wavelength light and to pass the short wavelength light through the light passages.

In another disclosed aspect, a phosphor conversion component comprises a substrate and a light conversion layer disposed on the substrate. The light conversion layer comprises a phosphor effective to convert short wavelength light having a peak wavelength of 570 nanometers or shorter to converted light. The light conversion layer includes light passages comprising openings or passage material that does not comprise the phosphor and is light transmissive for the short wavelength light.

In another disclosed aspect, a white light generation method is disclosed. Short wavelength light peaked at a peak wavelength of 570 nanometers or shorter is emitted. The short wavelength light is passed through at least a light conversion layer of a phosphor conversion component. The light conversion layer comprises a phosphor that converts the short wavelength light to converted light. Furthermore, the light conversion layer has light passages comprising openings or passage material that does not comprise the phosphor and is light transmissive for the short wavelength light whereby a portion of the short wavelength light passes through the light passages without being converted to converted light. White light is output, comprising a mixture of the converted light and the portion of the short wavelength light that passes through the light passages without being converted to converted light.

DETAILED DESCRIPTION

Known white light sources employing a blue light emitter in conjunction with a yellow phosphor have certain disadvantages. The phosphor thickness is designed to simultaneously optimize both the fraction of primary light that passes through the substrate without being converted and the fraction of primary light that is converted by the phosphor layer. This can limit flexibility of the design, as thinning the phosphor layer to increase the primary light that is passed concurrently reduces generation of the converted light; and likewise, increasing the thickness of the phosphor layer to decrease the primary light that is passed concurrently increases generation of the converted light. Furthermore, the passage of the primary light through the phosphor layer may alter characteristics of the primary light, e.g. by partial absorption of the primary light. Such absorption reduces efficiency and, if it is wavelength-dependent, changes the color content of the primary light. In particular, it is common for shorter wavelength light components to be preferentially absorbed over longer wavelength light components, which can reduce the "blueness" of the primary light. The interrelatedness of the various device parameters on the primary and converted light outputs can make it difficult to maintain lighting characteristics from one manufacturing run to the next, such as color temperature or color rendering, or to reliably manufacture white light devices with different characteristics in different runs (e.g. one run providing warm white light at 2700K and the next providing cold white light at 5000K).

These problems can be overcome by providing separate light sources for exciting the yellow phosphor and for mixing blue light to produce the final output white light. However, this approach requires a second short wavelength light source, or alternatively requires optics such as a beam splitter for splitting the light from a single short wavelength light source into two optical paths, thus increasing complexity and cost.

In white light sources disclosed herein, a light conversion layer comprising phosphor is provided, and is modified as disclosed herein to further have light passages comprising openings or passage material that does not comprise the phosphor and is light transmissive for the short wavelength light. In this approach, a single light source illuminates the light conversion layer with short wavelength (e.g. blue) light. The short wavelength light is converted to converted light (e.g. yellow light) by the phosphor, except at the light passages—at these passages the short wavelength light passes through so as to mix some short wavelength (e.g. blue) light with the converted (e.g. yellow) light. In a blue/yellow white light source of this design, the mixture (in appropriate proportions) of blue light passing through the light passages and yellow light converted by the phosphor creates white light.

In one manufacturing approach, a partially transparent phosphor is created by having phosphor applied to a substrate surface in such a manner that there are areas with phosphor applied and other areas (the short wavelength light passages) where there is no phosphor applied. For a given blue light source and given light conversion layer with a given phosphor and at a given thickness, the fill factor (that is, the ratio of phosphor covered area to total area) determines the blue/yellow ratio which controls the whiteness of the light and color temperature. Typically the fill factor will be in the range of 50% to 95% in order to create white light with the desired color temperature. Advantageously, other properties of the device such as the spectrum of the blue light source and/or the type of phosphor can be adjusted independently to further optimize the white light characteristics. In one contemplated approach, the light conversion layer with light passages is fabricated by applying the phosphor uniformly and then etching areas off using wet chemical etching, laser ablation, or the like to remove the layer at the light passages. In the case of wet chemical etching, the pattern of light passages can be defined using photolithographic techniques.

Such a white light source may be advantageously deployed in (by way of non-limiting illustrative example) projectors using transmissive phosphor wheels, reflective phosphor wheels, projectors using light transmissive microdisplays (e.g. LCD based), reflective microdisplays such as DLP and LCOS (reflective liquid crystal on silicon). For lighting applications the patterned light conversion layer can be applied directly to an LED or laser, or can be applied to an auxiliary substrate/external filter depending on the architecture.

In some contemplated embodiments, by choosing the size (i.e. aperture) of the short wavelength light passages through the light conversion layer, a designed amount of light diffraction is introduced into the short wavelength light passing through so as to form a desired output spatial distribution for the short wavelength light. In some embodiments, the spatial distribution of the short wavelength light is designed to be close to the spatial distribution of the yellow phosphor light (which is typically an approximately Lambertian spatial distribution). An approximately Lambertian spatial distribution for the blue light can be achieved, in some embodiments, by using sufficiently small-area apertures so as to introduce large-angle diffraction components. As a further variant, it is contemplated to form the light passages with a distribution of sizes and/or dimensions, preferably with the variously sized/dimensioned light passages interspersed over the area of the layer. In this design, the spatial distribution of the short wavelength light is effectively a weighted superposition of the spatial distributions achieved by the variously sized/dimensioned light passages, with the weights controlled by the ratios of the various sizes/dimensions. More generally, the goal in some embodiments is to produce the effect of diffusing the blue light to a desired degree which facilitates mixing with the yellow converted light. (Alternatively, this can be achieved by the addition of a downstream diffuser element).

Figure 1:
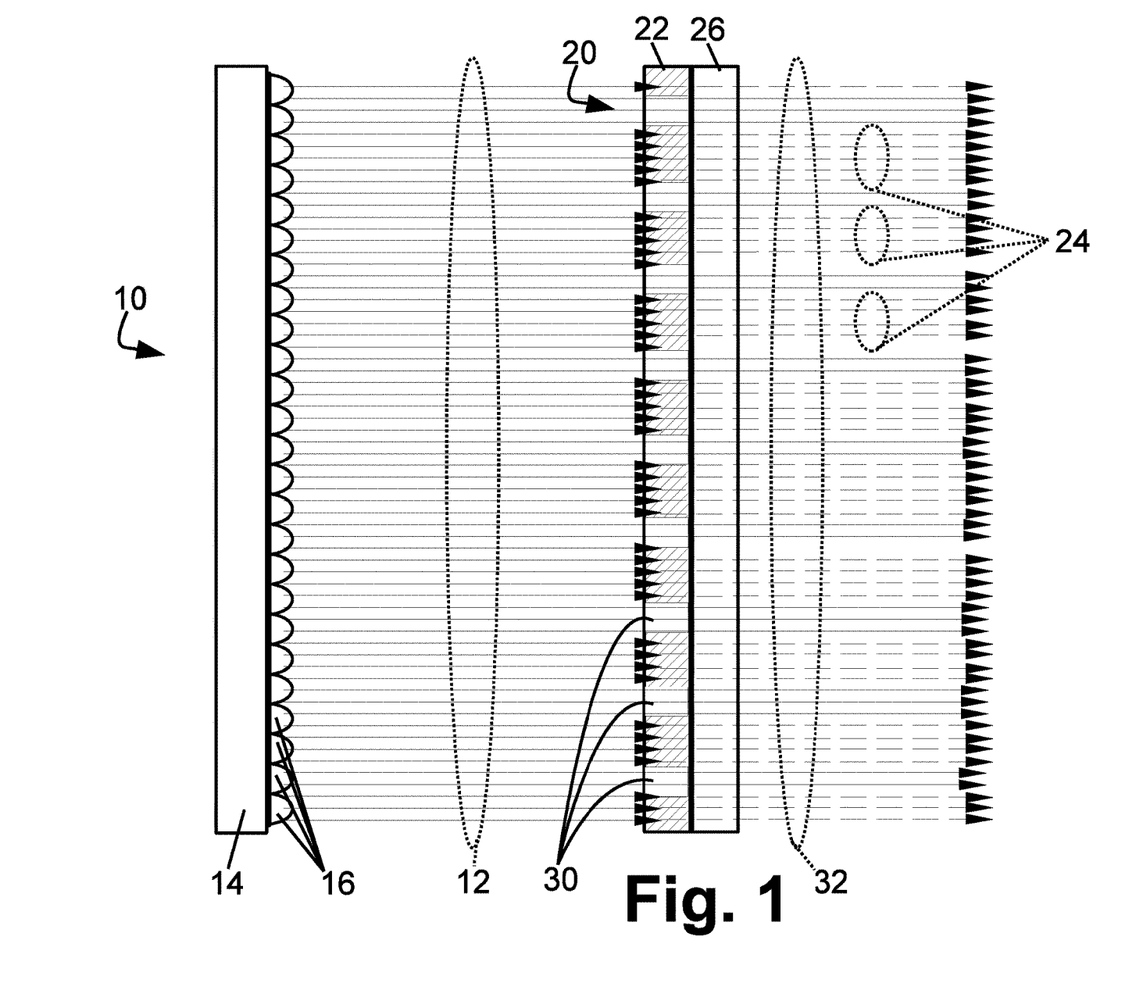
FIG. 1 diagrammatically shows a white light source including a phosphor conversion component shown in side sectional view in combination with film-side illumination by an illustrative short wavelength visible light source.
Figure 2:
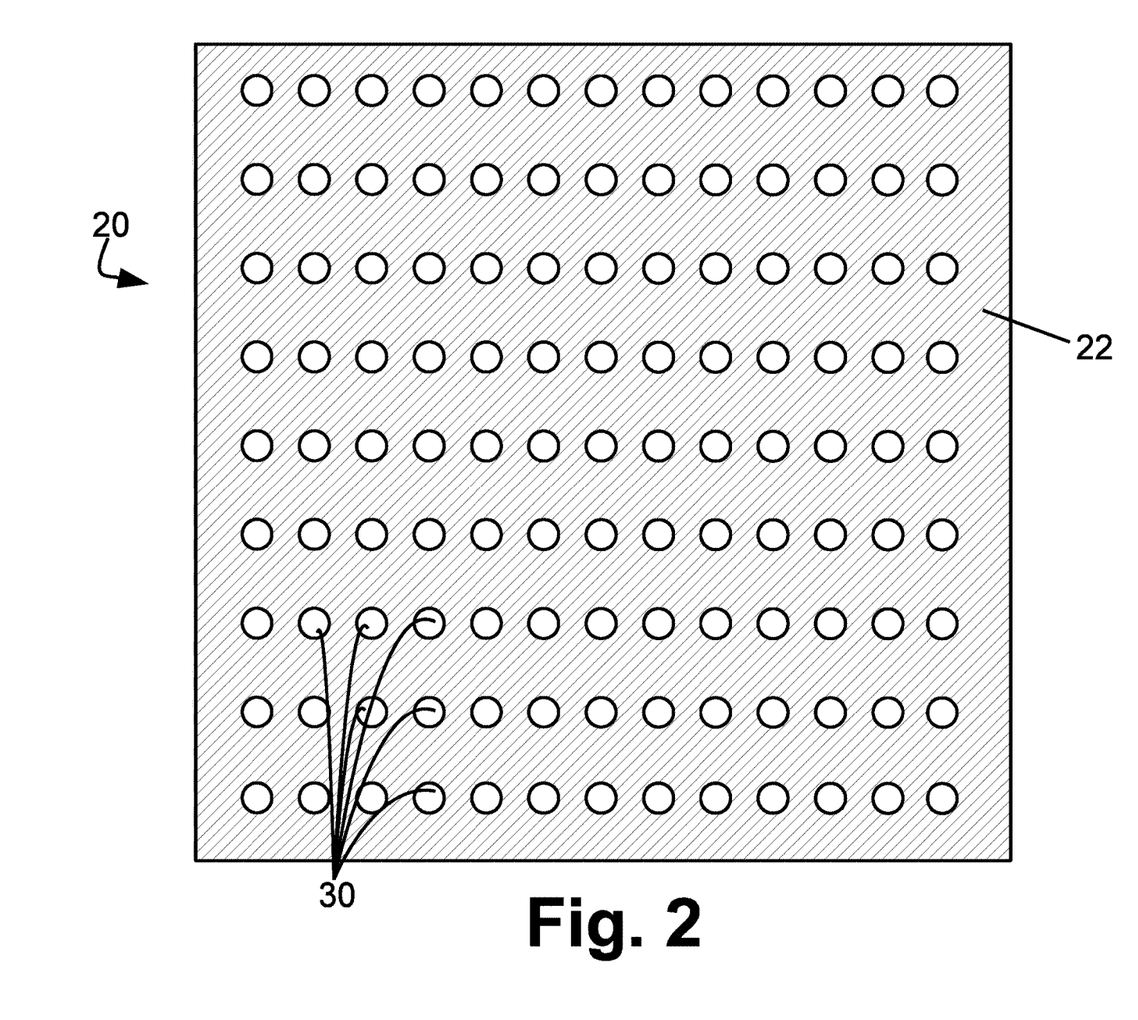
FIGS. 2 and 3 diagrammatically show a plan view (FIG. 2) and side sectional view (FIG. 3) of the phosphor conversion component of the white light source of FIG. 1.
Figure 3:
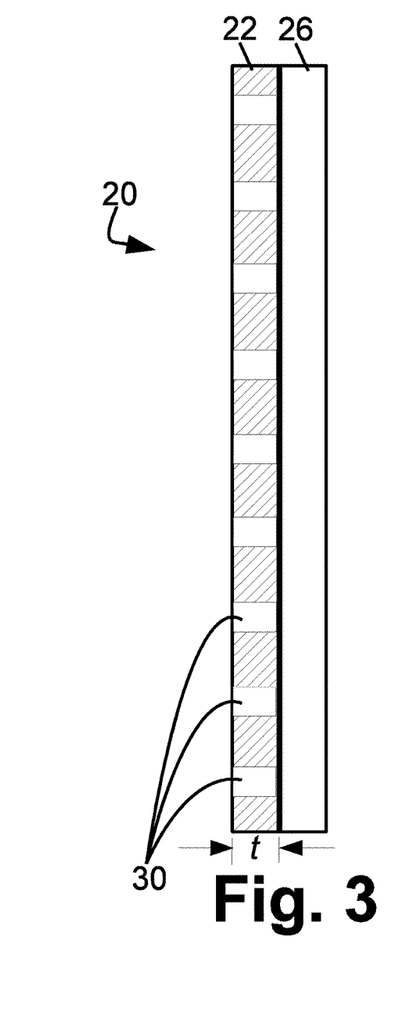

With reference now to FIGS. 1-3, a white light source comprises a light source 10 emitting short wavelength light 12 which is peaked at a peak wavelength of 570 nanometers or shorter. The illustrative light source 10 comprises a planar substrate 14, e.g. a printed circuit board (PCB), on which is disposed an array of light emitting diodes (LEDs) 16 which emit the short wavelength light 12; however, other types of light sources emitting suitable short wavelength light may be used, e.g. a semiconductor laser, an incandescent light source, or so forth. A phosphor conversion component 20 includes a light conversion layer 22 comprising a phosphor effective to convert the short wavelength light 12 to converted light 24. The illustrative phosphor conversion component 20 includes a light transmissive substrate 26, e.g. a glass plate, sapphire plate, transparent plastic plate, or so forth, on which the light conversion layer 22 is disposed. The illustrative white light source of FIG. 1 has the short wavelength light 12 impinging on the side of the phosphor conversion component 20 on which the light conversion layer 22 is disposed. However, it is alternatively contemplated to arrange the white light source so that the short wavelength light impinges on the substrate side of the phosphor conversion component 20 and passes through the light-transmissive substrate 26 to reach the light conversion layer 22. In the illustrative example of FIG. 1, the phosphor conversion component 20 is a plate, and the light source 10 emits the short wavelength light 12 as a collimated light beam that is directed normal to a surface of the light transmissive plate.

As best seen in FIGS. 2 and 3, which show a plan view (FIG. 2) and side sectional view (FIG. 3) of the phosphor conversion component 20 of the white light source of FIG. 1, the light conversion layer 22 includes light passages 30 comprising openings or passage material that does not comprise the phosphor and is light transmissive for the short wavelength light 12. The light source 10 is disposed respective to the phosphor conversion component 20 so as to illuminate the light conversion layer 22 with the emitted short wavelength light 12 and to pass the short wavelength light 12 through the light passages 30. This produces mixed light 32 comprising a mixture of the short wavelength light 12 that passes through the light passages 30 and the converted light 24.

The light source 10 emits the short wavelength light 12 peaked at a peak wavelength of 570 nanometers or shorter. While the LED array 16 is illustrated, more generally the light source 10 may comprise a monochromatic laser light source emitting monochromatic light at an emission line of 570 nanometers or shorter, or may comprise an LED, incandescent lamp, or other polychromatic light source emitting over a visible spectrum that is peaked at a peak wavelength of 570 nanometers or shorter. The wavelength of 570 nanometers approximately corresponds to the transition from green light to yellowish light. Mixing strongly green light with phosphor emission in the yellow range (i.e. the converted light 24) is likely to produce relatively poor quality white light 32; hence, in some preferred embodiments the light source 10 emits short wavelength light peaked at a peak wavelength of 500 nanometers or shorter (e.g., monochromatic light at an emission line of 500 nanometers or shorter, or polychromatic light over a visible spectrum that is peaked at a peak wavelength of 500 nanometers or shorter). The wavelength of 500 nanometers approximately corresponds to the transition from blue light to green light; hence, employing the light source 10 emitting with this specified shorter wavelength characteristic provides more pure bluish light which mixes with the phosphor emission (i.e. converted light 24) to produce a better quality of white light 32. It should be noted that in the case of a polychromatic short wavelength light source it is contemplated for the total spectrum of the short wavelength light to comprise the aforementioned visible spectrum further extending into the near ultraviolet—such ultraviolet light is not visible to the human eye. Similarly, in the case of a monochromatic light source (e.g. a laser), the output may be at multiple lines some of which may be in the ultraviolet and hence outside of the visible range.

The converted light 24 is output by the phosphor of the light conversion layer 22 energized by the short wavelength light 12. For a white light source design, the converted light 24 preferably has a peak wavelength of 490 nanometers or longer, corresponding to the green, yellow, orange, and red visible spectral regions. In a blue/yellow design the converted light 24 is preferably yellowish light, e.g. in the spectral range of roughly 560-590 nanometers. In an alternative blue/green/red design, the converted light 24 may have two peaks: a first peak at roughly 490-570 nanometers corresponding to greenish light, and a second peak at roughly 580 nanometers or longer corresponding to reddish light. In some such embodiments, the phosphor of the light conversion layer 22 suitably includes separate green and red phosphors in proportions chosen to provide the desired green/red light ratio. These are merely illustrative examples, and the precise phosphor composition and the precise spectral composition of the short wavelength light 12 may be chosen to provide white light 32 of a desired color temperature, color rendering index (CRI), or other desired spectral and/or "whiteness" characteristics.

The light conversion layer 22 has a thickness t as indicated in FIG. 3. In some embodiments, the light conversion layer 22 is of sufficient thickness so that substantially all of the short wavelength light 12 that impinges on the light conversion layer 22 is converted to converted light 24, and/or is partially absorbed by the light conversion layer 22. In this case, substantially no short wavelength light passes through the light conversion layer 22. To quantify this, the light penetration depth δ of the light conversion layer 22 is defined as the depth at which the initial light intensity of the short wavelength light 12 decreases to 1/e≈0.368 of its initial value. This definition of the light penetration depth δ is a conventional definition constructed on the basis of a conventional model of light absorption in which the light intensity at a distance x into the layer is given as $I=I_0 e^{\alpha x}$ where δ=1/α. Using these conventions, if the light conversion layer 22 has a thickness of 3δ then it attenuates the initial short wavelength light 12 to under 5% of its initial intensity. This is deemed to constitute substantially all of the short wavelength light 12 that impinges on the light conversion layer 22 being converted (or absorbed) by the light conversion layer 22. In some embodiments the light conversion layer 22 has a thickness of at least 3δ, and accordingly the blending of the short wavelength light 12 and the converted light 24 is controlled (almost) entirely by a ratio R of the total area of the light passages 30 compared with the total area of the light conversion layer 22 (including the light passages 30). To take a limiting case, R=0 corresponds to having no light passages 30; while, R=0.5 corresponds to the total area of the light passages 30 being one-half of the total area of the light conversion layer 22. It will be appreciated that as the R increases this corresponds to a greater fraction of the short wavelength light 12 passing through the light passages 30 and a smaller fraction of that light being converted to converted light 24. Advantageously, the ratio R is entirely controlled by the geometry of the array of light passages 30 (their number or density, and their size) which can be precisely controlled by suitable techniques such as photolithographic wet or dry etching.

To obtain homogenous white light 32, the short wavelength light 12 that passes through the light passages 30 and the converted light 24 should be well-mixed (i.e. well-blended). Various approaches can be employed to promote blending or mixing of the short wavelength light 12 that passes through the light passages 30 and the converted light 24. In one approach, the light passages 30 are relatively small and closely spaced. The light passages 30 may optionally have lateral size (e.g. diameter in the illustrative case of light passages 30 with circular cross-section) that is small enough to produce diffraction of the short wavelength light 12 passing through the light passages 30. In some embodiments, the light passages 30 have a lateral dimension that is less than or equal to 20 times the peak wavelength to obtain stronger and/or higher angle diffraction. (In other embodiments, larger-diameter light passages are employed such that no diffraction is obtained, or insufficient diffraction is obtained to provide the desired spatial distribution, and a downstream diffuser or other added optics is provided to shape the light distribution). Depending upon the formation process for forming the light passages 30, they may have roughened sidewalls that further promote light scattering and consequent blending. As another option, the light-transmissive substrate 26 can include light scattering particles (e.g., $Al_2O_3$ particles dispersed in a glass or plastic substrate), have a roughened backside surface, have a backside surface coated with a light-scattering layer, or otherwise be configured as a light diffuser plate. This approach is typically most effective with the orientation shown in FIG. 1 in which the short wavelength light 12 impinges on the light conversion layer 22, so that the white light 32 then passes through the light-diffusing substrate 26. As yet another contemplated approach, the light passages 30 may be filled with passage material that does not comprise the phosphor and is light transmissive for the short wavelength light 12, and which passage material also includes light scattering particles (e.g., scattering by reflection and/or refractive effects). For example, the passage material may be a transparent epoxy filler in which reflective $Al_2O_3$ particles are dispersed so as to scatter the short wavelength light 12 passing through the epoxy-filled light passages 30.

Figure 4:
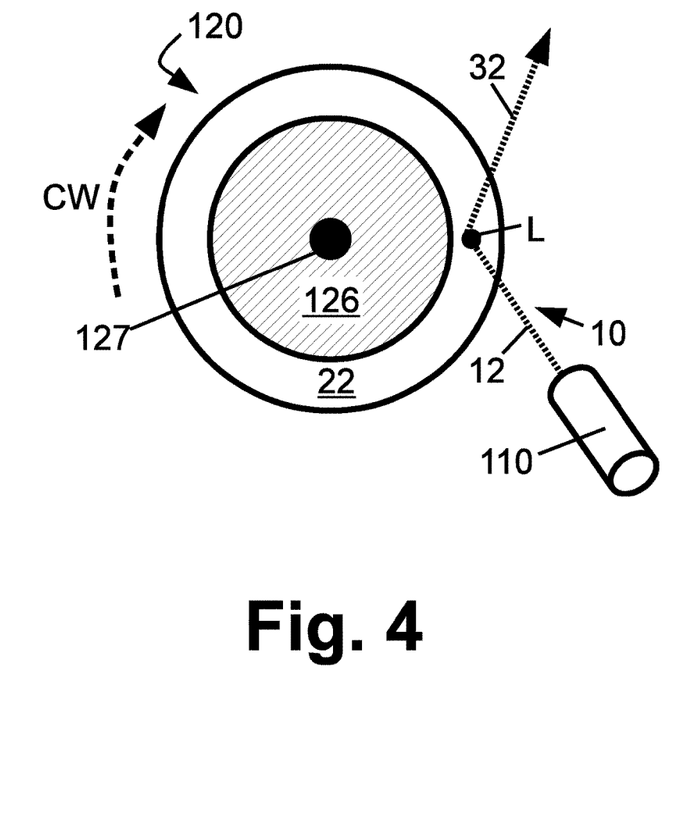
FIG. 4 diagrammatically shows a white light source including a phosphor conversion component comprising a reflective phosphor wheel.
Figure 5:
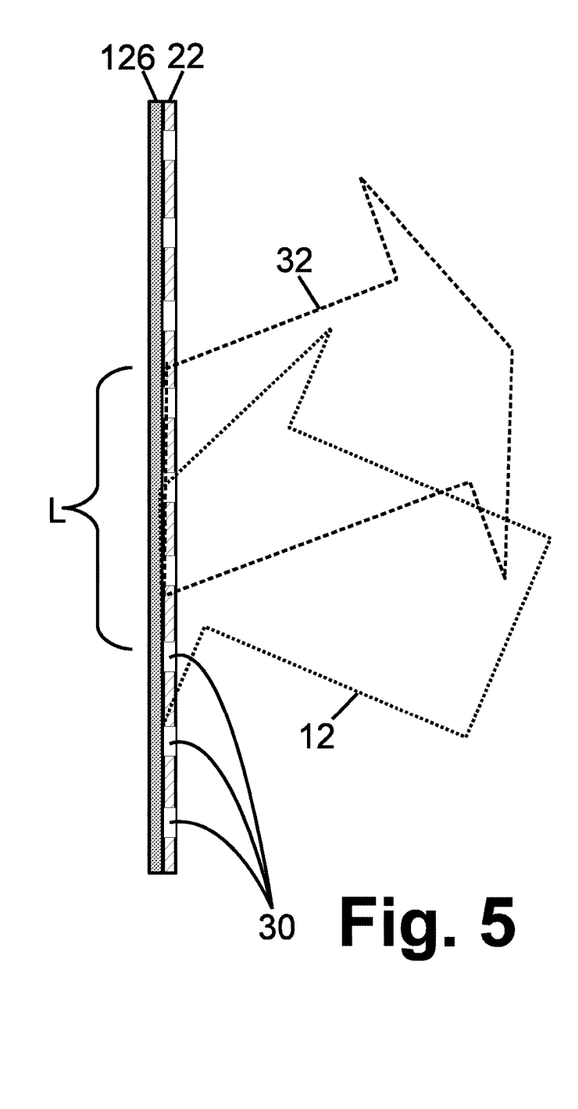
FIG. 5 diagrammatically illustrates a side sectional view of a portion of the phosphor wheel of FIG. 4.

With reference to FIGS. 4 and 5, another embodiment is described, in which a white light source 110 emitting the short wavelength light 12 peaked at a peak wavelength of 570 nanometers or shorter (and in some embodiments is peaked at a peak wavelength of 500 nanometers or shorter) is in the form of a laser 110, and a phosphor conversion component 120 is in the form of a rotating reflective phosphor wheel 120 having the light conversion layer 22 disposed on a reflective substrate 126 that is reflective for the short wavelength light 12 and for the converted light. In the reflective configuration, the light source 100 is disposed respective to the phosphor conversion component 120 so as to illuminate the light conversion layer 22 with the emitted short wavelength light 12 and to pass the short wavelength light 12 through the light passages 30 and reflect from the reflective substrate 126 back through the light passages 30. The illustrative phosphor conversion component 120 comprises a phosphor wheel 120 including a disk 126 arranged to rotate about a central axis 127 of the disk, and the light conversion layer 22 is disposed on at least a portion of the disk, namely in an outer annular region of the disk 126 in the illustrative example of FIG. 4. The metal disk or "wheel" 126 may, by way of non-limiting illustration, be made of copper, a copper alloy, an aluminum alloy, silver-coated glass, or so forth. The light conversion layer 22 is attached to or coated on an outer perimeter of the wheel 126, that is, disposed at or near the outer rim of the wheel 126. In operation the metal wheel 126 is rotated about the central axis 127, for example, by connecting a motor shaft of a motor (not shown) to the central axis 127 and operating the motor to rotate the phosphor wheel 126 in an illustrated clockwise direction CW (counterclockwise rotation is also contemplated). Simultaneously with the rotation, the laser 110 applies the short wavelength light 12 to a local region—this is diagrammatically indicated in FIG. 4 by the laser 110 applying an illustrative pump laser beam spot L. As the metal wheel 126 rotates the portion of the annular light conversion layer 22 located at the spot L changes, so as to limit (or spread) the generated heat. This can allow for higher power operation. FIG. 5 diagrammatically shows a side sectional view. In the illustrative optical configuration the short wavelength light 12 is applied at an angle and the resulting white light 32 is emitted at a reflective angle as seen in FIG. 5. Other configurations are contemplated, e.g. using mirrors, lenses, and/or other optical components to configure the light paths. Due to the angled light incidence and reflection the thickness of the light conversion layer 22 should be sufficiently thin to permit short wavelength light 12 that passes through the light passages 30 to reflect back through the (same) passages. In some embodiments it is contemplated to facilitate this by configuring the light passages 30 as elongated slots or slits in the light conversion layer 22, with the long direction of the slots or slits aligned with the angle of incidence/reflection.

The illustrative phosphor conversion element 120 formed as a phosphor wheel 120 employs a reflective configuration with reflective substrate 126. However, it will be appreciated that a light transmissive phosphor wheel may be similarly constructed by replacing the reflective substrate 126 with the light transmissive substrate 26 of the embodiment of FIGS. 1-3. This alternative light transmissive phosphor wheel embodiment has an advantage in that the short wavelength light 12 can be applied normal to the surface of the phosphor wheel so that the white light 32 is transmitted light that passes through the phosphor wheel (with some fraction being converted to converted light 24 as described with reference to FIG. 1).

In addition to, or in place of, heat load spreading by way of rotation in the case of the rotating phosphor wheel 120 of FIGS. 4 and 5, other cooling mechanisms may be provided, which may also be applicable for the static embodiments of FIGS. 1-3. For example, the substrate 26, 126 may be made of a thermally conductive material. In the case of a reflective substrate, a thermally conductive metal plate may be used to remove or spread the heat. For a light-transmissive substrate, a thermally conducting transparent polymer material is contemplated to improve heat removal or spreading. Additionally or alternatively, other mechanisms for cooling the light conversion layer 22 may be provided, such as liquid cooling, thermoelectric cooling (applicable for stationary or rotating phosphors for high fluence applications), addition of a dedicated heat sink optionally with forced air cooling, or so forth. Depending upon the application, the light source 10, 110 could be pulsed in time to provide cooling intervals, with the pulsing being at a frequency and duty cycle chosen to be amenable for the particular application.

The invention has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. A white light source comprising:
    a light source emitting short wavelength light peaked at a peak wavelength of 570 nanometers or shorter; and
    a phosphor conversion component including a light conversion layer comprising a phosphor effective to convert the short wavelength light to converted light, the light conversion layer including light passages comprising openings or passage material that does not comprise the phosphor and is light transmissive for the short wavelength light;
    wherein the light source is disposed respective to the phosphor conversion component so as to illuminate the light conversion layer with the emitted short wavelength light and to pass the short wavelength light through the light passages; and
    wherein the light passages have a lateral dimension that is less than or equal to 20 times the peak wavelength of the short wavelength light.

2. The white light source of claim 1 wherein the phosphor conversion component comprises:
    a light-transmissive substrate that is light transmissive for the short wavelength light; and
    said light conversion layer disposed on the light-transmissive substrate.

3. The white light source of claim 2 wherein the light transmissive substrate comprises light scattering particles.

4. The white light source of claim 2 wherein the light transmissive substrate comprises a light transmissive plate.

5. The white light source of claim 4 wherein the light source emits said short wavelength light as a collimated light beam directed normal to a surface of the light transmissive plate.

6. The white light source of claim 1 wherein the phosphor conversion component comprises:
    a reflective substrate that is reflective for the short wavelength light and for the converted light; and
    said light conversion layer disposed on the reflective substrate;
    wherein the light source is disposed respective to the phosphor conversion component so as to illuminate the light conversion layer with the emitted short wavelength light and to pass the short wavelength light through the light passages and reflect from the reflective substrate back through the light passages.

7. The white light source of claim 1 wherein the phosphor conversion component comprises a phosphor wheel including a disk arranged to rotate about a central axis of the disk and said light conversion layer disposed on at least a periphery of the disk.

8. The white light source of claim 1 wherein the peak wavelength is 500 nanometers or shorter.

9. The white light source of claim 1 wherein the converted light has a peak wavelength of 490 nanometers or longer.

10. The white light source of claim 1 wherein the light conversion layer has a thickness that is at least three times a light penetration depth of the short wavelength light in the light conversion layer.

11. A phosphor conversion component comprising:
    a substrate;
    a light conversion layer disposed on the substrate and comprising a phosphor effective to convert short wavelength light having a peak wavelength of 570 nanometers or shorter to converted light;
    wherein the light conversion layer includes light passages comprising openings or passage material that does not comprise the phosphor and is light transmissive for the short wavelength light; and wherein the light passages have a lateral dimension that is less than or equal to 20 times the peak wavelength of the short wavelength light.

12. The phosphor conversion component of claim 11 wherein the substrate is a light-transmissive substrate that is light transmissive for the short wavelength light.

13. The phosphor conversion component of claim 12 wherein the light transmissive substrate comprises light scattering particles.

14. The phosphor conversion component of claim 12 wherein the light transmissive substrate comprises a light transmissive plate.

15. The phosphor conversion component of claim 11 wherein the substrate is a reflective substrate that is reflective for the short wavelength light and for the converted light.

16. The phosphor conversion component of claim 11 wherein the phosphor conversion component comprises a phosphor wheel including a disk arranged to rotate about a central axis of the disk and said light conversion layer disposed on at least a periphery of the disk.

17. The phosphor conversion component of claim 11 wherein the converted light has a peak wavelength of 490 nanometers or longer.

18. The phosphor conversion component of claim 11 wherein the light conversion layer has a thickness that is at least three times a light penetration depth of the short wavelength light in the light conversion layer.

19. A white light generation method comprising:

emitting short wavelength light peaked at a peak wavelength of 570 nanometers or shorter;

passing the short wavelength light through at least a light conversion layer of a phosphor conversion component wherein the light conversion layer comprises a phosphor that converts the short wavelength light to converted light and wherein the light conversion layer has light passages comprising openings or passage material that does not comprise the phosphor and is light transmissive for the short wavelength light whereby a portion of the short wavelength light passes through the light passages without being converted to converted light;

wherein the light passages have a lateral dimension that is less than or equal to 20 times the peak wavelength of the short wavelength light; and outputting white light comprising a mixture of the converted light and the portion of the short wavelength light that passes through the light passages without being converted to converted light.

20. The white light generation method of claim 19 wherein the phosphor conversion component further includes a reflective substrate and the passing of the short wavelength light through at least the light conversion layer of the phosphor conversion component further comprises reflecting the converted light and the portion of the short wavelength light that passes through the light passages without being converted to converted light off the reflective substrate.

21. The white light generation method of claim 19 wherein the phosphor conversion component comprises a phosphor wheel and the method further comprises rotating the phosphor wheel about an axis during the emitting, passing, and outputting operations.

* * * * *